US010566256B2

(12) United States Patent
Chen et al.

(10) Patent No.: US 10,566,256 B2
(45) Date of Patent: Feb. 18, 2020

(54) TESTING METHOD FOR TESTING WAFER LEVEL CHIP SCALE PACKAGES (71) Applicant: WINWAY TECHNOLOGY CO., LTD., Kaohsiung (TW)

(72) Inventors: Kuan-Chung Chen, Kaohsiung (TW); Cheng-Hui Lin, Kaohsiung (TW); Chia-Pin Sun, Kaohsiung (TW)

(73) Assignee: WINWAY TECHNOLOGY CO., LTD., Kaohsiung (TW)

( * ) Notice: Subject to any disclaimer, the term of this patent is extended or adjusted under 35 U.S.C. 154(b) by 2 days.

(21) Appl. No.: 15/862,218

(22) Filed: Jan. 4, 2018

(65) Prior Publication Data

US 2019/0206750 A1   Jul. 4, 2019

(51) Int. Cl.
*G01R 1/06* (2006.01)
*H01L 21/66* (2006.01)
(Continued)

(52) U.S. Cl.
CPC .......... *H01L 22/34* (2013.01); *G01R 1/06733* (2013.01); *G01R 1/073* (2013.01); *G01R 1/07307* (2013.01); *G01R 1/07314* (2013.01); *G01R 31/2886* (2013.01); *H01L 21/6836* (2013.01); *H01L 24/06* (2013.01); *G01R 1/06722* (2013.01); *G01R 31/2831* (2013.01); *H01L 24/13* (2013.01);
(Continued)

(58) Field of Classification Search
CPC ...... H01L 22/34; H01L 24/06; H01L 21/6836
See application file for complete search history.

(56) References Cited

U.S. PATENT DOCUMENTS 7,049,837 B2 * 5/2006 Kasukabe ............ G01R 1/0735
324/754.07
2003/0210068 A1 * 11/2003 Fujiwara ............ G01R 31/2831
324/754.03
(Continued)

FOREIGN PATENT DOCUMENTS

CN   106483345 A   3/2017
JP   2012-63227 A   3/2012
(Continued)

OTHER PUBLICATIONS

Search Report appended to an Office Action, which was issued to Taiwanese counterpart application No. 106129658 by the TIPO dated Feb. 14, 2018, with an English translation thereof, 2 pages.

*Primary Examiner* — Alvaro E Fortich
(74) *Attorney, Agent, or Firm* — Muncy, Geissler, Olds & Lowe, PC (57) ABSTRACT

A testing method for testing wafer level chip scale packages formed on a wafer including a wafer substrate and spaced-apart contact electrodes disposed on the wafer substrate, includes: providing a test device including a probe card formed with a plurality of parallel probe holes having a uniform cross-sectional dimension, and a plurality of probes respectively received in the probe holes and extending respectively in the probe holes along axes of the probe holes; and electrically connecting the contact electrodes to the probes. A distance between the axes of two adjacent ones of the probe holes is equal to a smallest spacing between two adjacent ones of the contact electrodes and is not greater than 0.5 mm.

7 Claims, 6 Drawing Sheets

(51) Int. Cl.
    *H01L 21/683*     (2006.01)
    *H01L 23/00*     (2006.01)
    *G01R 31/28*     (2006.01)
    *G01R 1/073*     (2006.01)
    *G01R 1/067*     (2006.01)

(52) U.S. Cl.
    CPC   *H01L 2224/056* (2013.01); *H01L 2224/0556* (2013.01); *H01L 2924/00014* (2013.01)

(56) References Cited

U.S. PATENT DOCUMENTS

| | | | | |
|---|---|---|---|---|
| 2007/0040565 | A1* | 2/2007 | Jayabalan | G01R 31/2831 29/593 |
| 2007/0268035 | A1* | 11/2007 | Yamaguchi | G01R 1/07314 324/756.03 |
| 2008/0164893 | A1 | 7/2008 | Lee et al. | |
| 2012/0313659 | A1* | 12/2012 | Hsu | G01R 1/06772 324/755.05 |
| 2013/0171750 | A1* | 7/2013 | Guu | H01L 22/14 438/15 |
| 2014/0340109 | A1* | 11/2014 | Hung | G01R 31/2887 324/756.03 |

FOREIGN PATENT DOCUMENTS

| | | | | |
|---|---|---|---|---|
| TW | 201727243 | A | 8/2017 | |
| TW | 201728908 | * | 8/2017 | ............ G01R 1/073 |
| TW | 201728908 | A | 8/2017 | |

\* cited by examiner

TESTING METHOD FOR TESTING WAFER LEVEL CHIP SCALE PACKAGES

FIELD

The disclosure relates to a testing method for testing electronic packages, and more particularly to a testing method for testing wafer level chip scale packages formed on a wafer.

BACKGROUND

As part of quality control process before shipment, electrical performance of electronic components and integrated circuits arranged on electronic chips are required to be tested before or after these electronic chips are packaged. In light of the current trend towards decreasing the size and enhancing the precision of an electronic package according to market demand, the electronic package has now become smaller in size and with greater circuit density, and is even required to meet a specification of wafer level chip scale packages, where a smallest spacing between two adjacent ones of the electronic components arranged on the electronic chip scale packages is limited to be not greater than 0.5 mm. Hence, research and development of test devices that are suitable for testing these wafer level chip scale packages are also required to meet the current trend.

Figure 1:
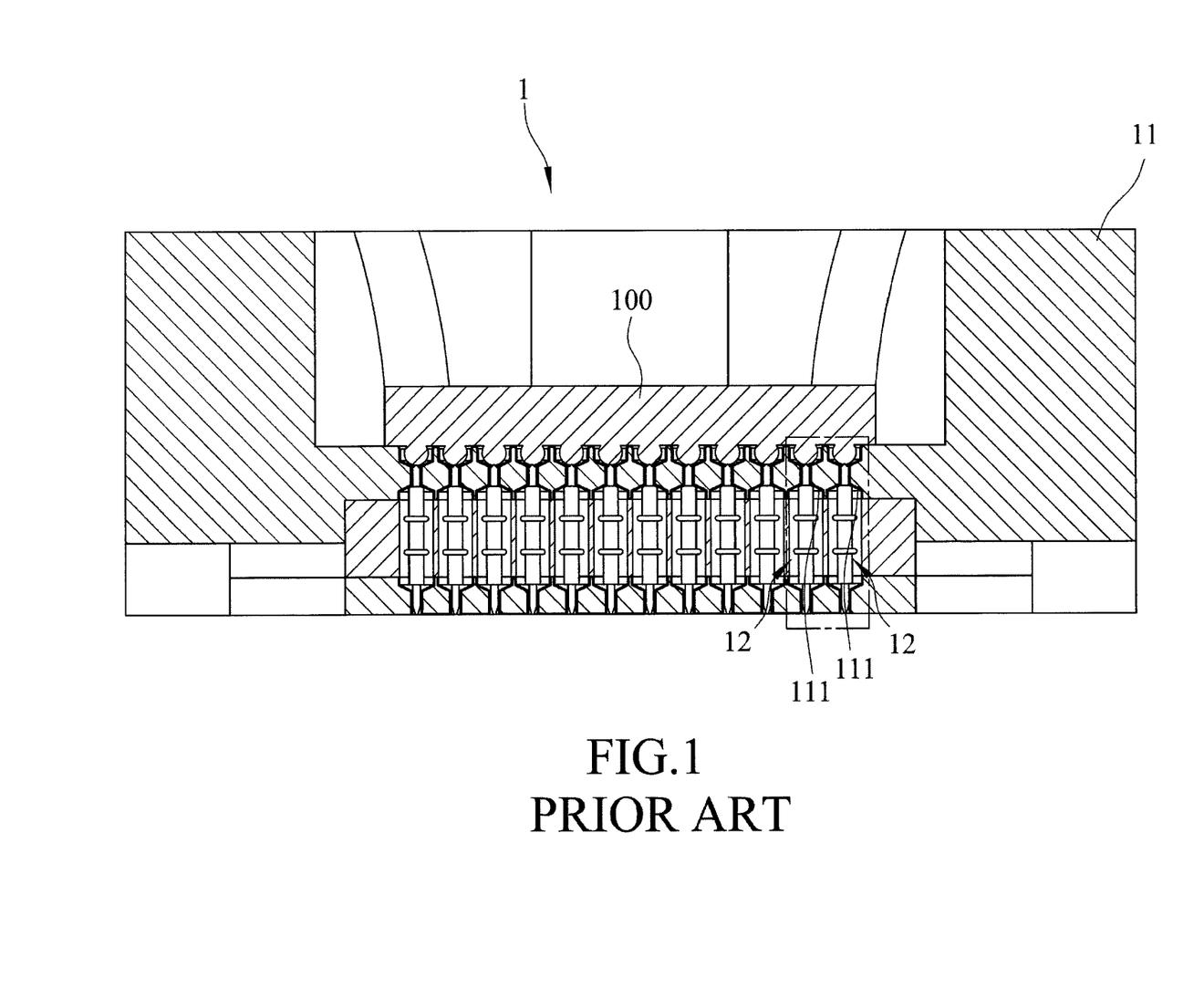
FIG. 1 is a schematic cross-sectional view of a conventional test device opted by a conventional testing method for testing an electronic component.

Referring to FIG. 1, a conventional test device 1 includes a metallic test seat 11 that is formed with a plurality of probe holes 111, and a plurality of spring probes 12 that are respectively received in the probe holes 111. The spring probes 12 are used for being electrically connected to electronic component 100 to be tested. The metallic nature of the test seat 11 produces an electromagnetic shielding effect which prevents the spring probes 12 from electrically interfering with each other. Therefore, the test performance of the test device 1 is enhanced.

However, for firmly positioning the spring probes 12 in the probe holes 111, each probe hole 111 has an internal diameter varied along an axial direction of the probe hole 111, which imposes a limitation when it is desired to decrease a distance between two adjacent ones of the spring probes 12. Hence, the conventional test device 1 cannot be used to test the electrical performance of the wafer level chip scale packages.

Figure 2:
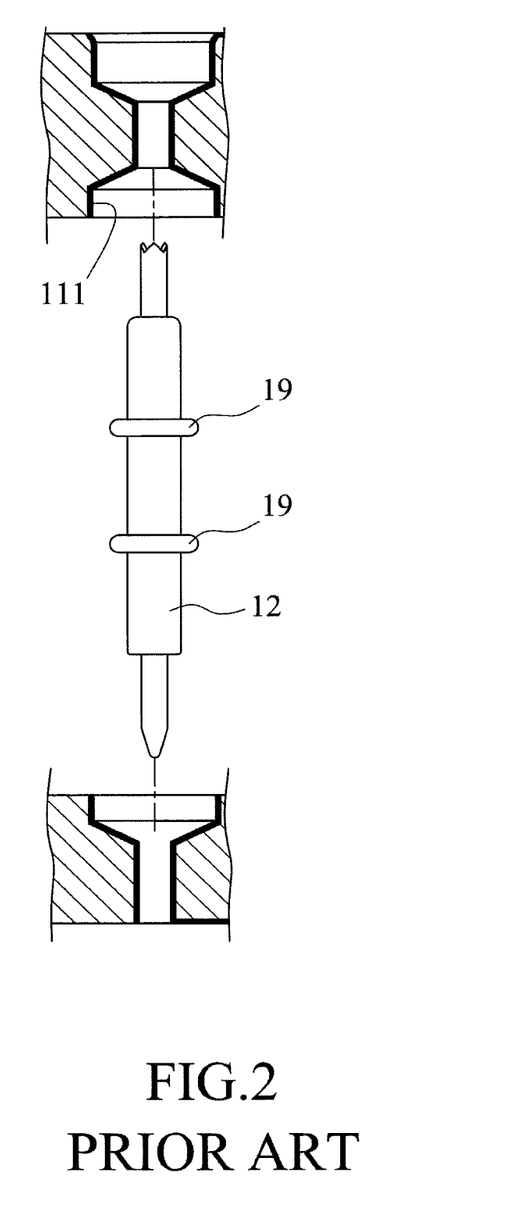
FIG. 2 is a schematically fragmentary exploded view illustrating placement of a probe in a corresponding probe hole of the conventional test device of FIG. 1.

Further referring to FIG. 2, each of the spring probes 12 of the conventional test device 1 is surrounded by more than one insulating rings 19 when installed in a respective one of the probe holes 111. Arrangement of the insulating rings 19 increases difficulty in using the conventional test device 1 to test the wafer level chip scale packages. Therefore, there is still a need in the art to provide a test device suitable for wafer level chip scale packages.

SUMMARY

Therefore, an object of the disclosure is to provide a testing method for testing wafer level chip scale packages formed on a wafer that can alleviate at least one of the drawbacks of the prior art.

According to the disclosure, the testing method is adapted for testing the wafer level chip scale packages formed on the wafer that includes a wafer substrate, and a plurality of spaced-apart contact electrodes disposed on the wafer substrate. A smallest spacing between two adjacent ones of the contact electrodes is not greater than 0.5 mm.

The testing method includes: providing a test device that includes a probe card and a plurality of probes, and electrically connecting each of the contact electrodes of the wafer level chip scale packages to a corresponding one of the probes. The probe card has a first side adapted to be in contact with the wafer substrate and a second side opposite to the first side, and is formed with a plurality of parallel probe holes. The probes are respectively received in the probe holes. The probe card is made of metal. The probe holes have a uniform cross-sectional dimension. The probes extend respectively in the probe holes along axes of the probe holes. At least one distance between the axes of two adjacent ones of the probe holes is equal to the smallest spacing of the two adjacent ones of the contact electrodes.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
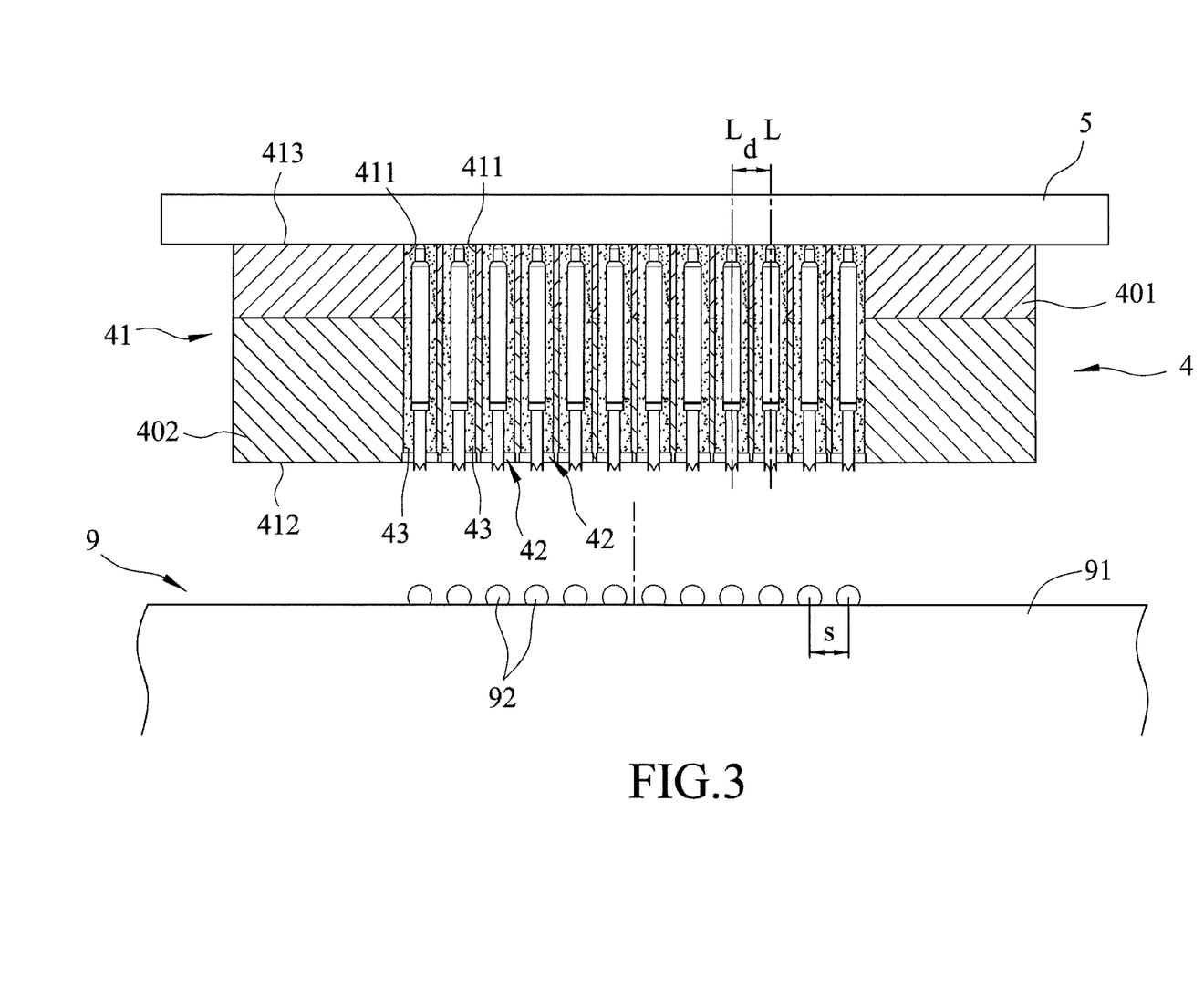
FIG. 3 is a schematic cross-sectional view of a test device adapted for an embodiment of a testing method according to the disclosure.
Figure 4:
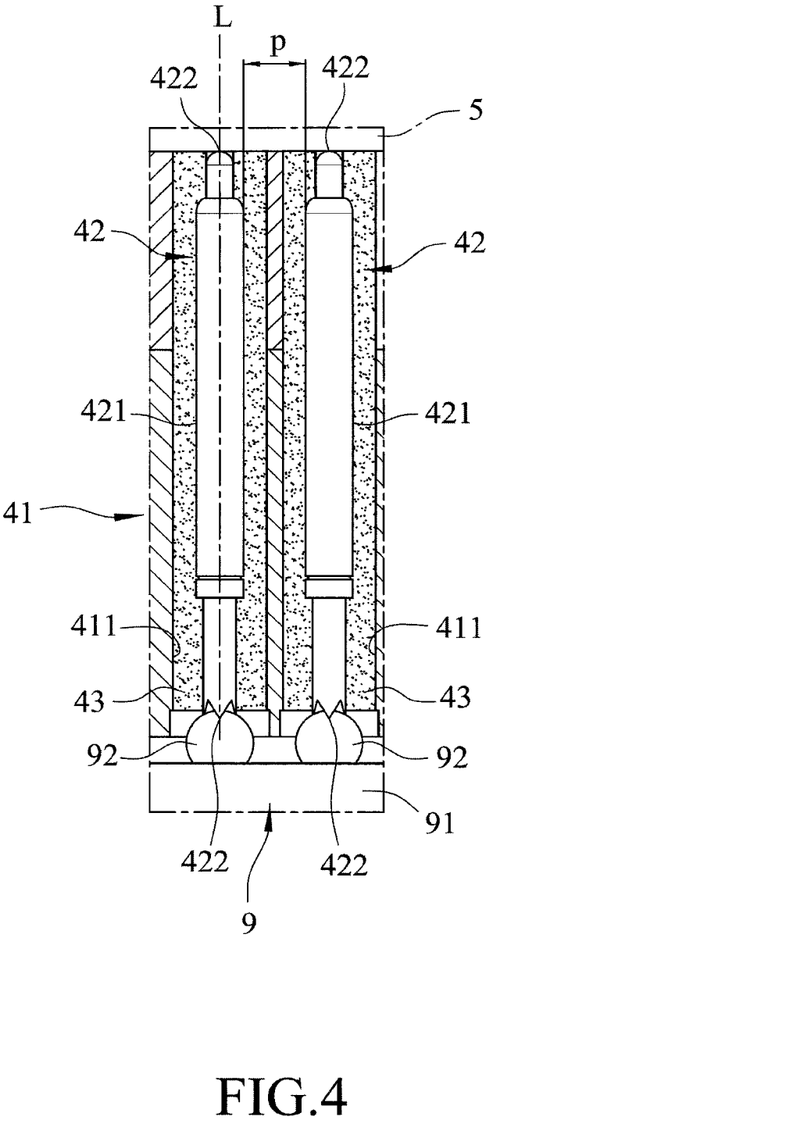
FIG. 4 is a schematically fragmentary cross-sectional view illustrating testing operation of the test device according to the embodiment of the testing method of the disclosure.

Referring to FIGS. 3 and 4, an embodiment of a testing method adapted for testing wafer level chip scale packages formed on a wafer 9 is provided. The wafer 9 includes a wafer substrate 91, and a plurality of spaced-apart contact electrodes 92 that are disposed on the wafer substrate 91. A smallest spacing (s) between two adjacent ones of the contact electrodes 92 is not greater than 0.5 mm, which is a size of a wafer level chip scale package in the field. The testing method includes: providing a test device 4, and electrically connecting the contact electrodes 92 of the wafer level chip scale packages to the test device 4.

The test device 4 to be provided includes a probe card 41 that has a first side 412 adapted to be in contact with the wafer substrate 91 and a second side 413 opposite to the first side 412 and that is formed with a plurality of parallel probe holes 411, and a plurality of probes 42 that are respectively received in the probe holes 411. The probe card 41 is made of metal. The probe holes 411 have a uniform cross-sectional dimension. The probes 42 extend respectively in the probe holes 411 along axes (L) of the probe holes 411. At least one distance (d) between the axes (L) of two adjacent ones of the probe holes 411 is equal to the smallest spacing (s) of the two adjacent ones of the contact electrodes 92.

More specifically, the probe card 41 of the test device 4 further includes an upper part 401 and a lower part 402 connected to the upper part 401. The probe holes 411 extend through the upper part 401 and the lower part 402.

Since the probes 42 have the uniform cross-sectional dimension, a spacing (p) between the probes 42 respectively positioned in the two adjacent ones of the probe holes 411 will be around the diameter of each of the two adjacent probe holes 411 when the probe holes 411 are more densely arranged due to size minimization of the test device 4. Therefore, the test device 4 can be used for testing the wafer level chip scale packages formed on the wafer 9. Besides, the at least one distance (d) between the axes (L) of two adjacent ones of the probe holes 411 is 0.5 mm, and a spacing (p) between the probes 42 respectively received in the two adjacent ones of the probe holes 411 is also 0.5 mm.

Each of the contact electrodes 92 of the wafer level chip scale packages is electrically connected to a corresponding one of the probes 42. To be specific, a wafer testing substrate 5 is first disposed on the upper part 401 of the probe card 41 and electrically connected to the probes 42 of the test device 4, such that the performance of the wafer 9 can be evaluated using the embodiment of the test method in cooperation with the wafer testing substrate 5. It is worth noting that, when electric signals are transferred by the probes 42, the interference among the probes 42 with each other would be reduced through the electromagnetic shielding effect generated by the metallic probe card 41, thus conferring accuracy of the test results.

In the embodiment, the test device 4 further includes insulating fillers 43 respectively disposed in the probe holes 411 and surrounding the probes 42. Each of the probes 42 has two opposite end faces 422 and a peripheral surface 421 extending between the opposite end faces 422. Each of the insulating fillers 43 surrounds entirely the peripheral surface 421 of a respective one of the probes 42 and does not cover the opposite end faces 422 of the respective one of the probes 42. By virtue of the insulating fillers 43, the probes 42 are electrically insulated from one another, and thus electric signals transferred by the probes 42 are isolated from one another. In other words, the electric signals are not transferred through the probe card 41. In addition, since the insulating fillers 43 do not cover the opposite end faces 422 of the probes 42 and since the probes 42 are in contact with the contact electrodes 92, the test results are therefore relatively reliable. Furthermore, with the probe holes 411 having a uniform cross-sectional dimension, the insulating fillers 43 are filled in the probe holes 411 before the installation of the probes 42, thereby simplifying the manufacturing process and enhancing the yield of the test device 4.

The probes 42 of the test device 4 cooperatively serve three functions: power source connection, grounding, and signal transfer. In other words, at least one of the probes 42 is used for power source connection, at least one the probes 42 is used for grounding, and the remainder of the probes 42 are used for signal transfer. The at least one probe 42 for grounding directly contacts the probe card 41. Since the entire peripheral surface 421 of the at least one probe 42 for power source connection is surrounded with a respective one of the insulating fillers 43, short circuit during the operation of the test device 4 can be avoided effectively.

Figure 5:
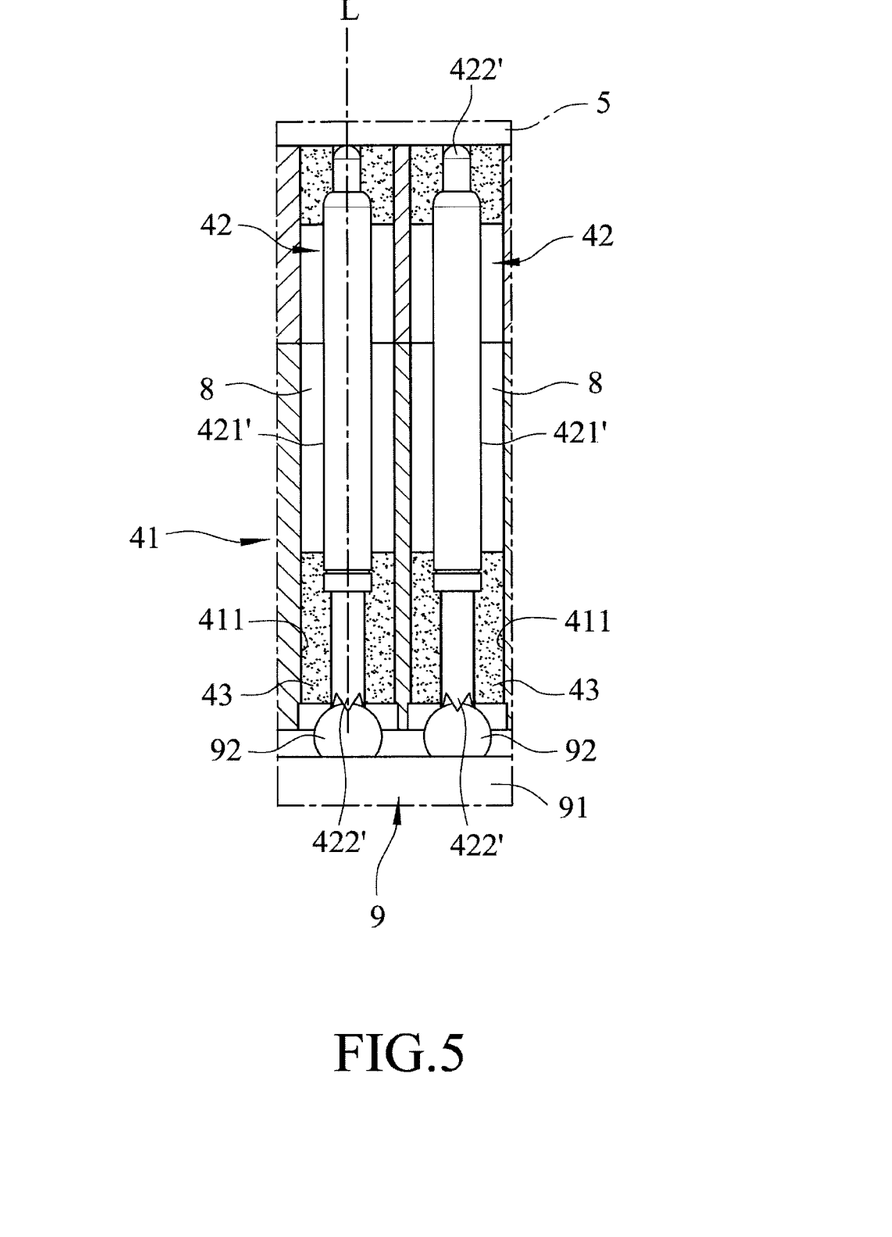
FIG. 5 is a schematically fragmentary cross-sectional view illustrating a modification of the embodiment of the testing method of the disclosure using another configuration of the test device.

Referring to FIG. 5, a modification of the embodiment of the testing method of the disclosure using another configuration of the test device 4 is illustrated. Each of the probes 42 includes two opposite end portions 422' and a peripheral surface 421' extending between the opposite end portions 422'. The peripheral surface 421' of each of the probes 42 is partially surrounded by a respective one of the insulating fillers 43 such that an air gap 8 is formed within a respective one of the probe holes 411 around a respective one of the probes 42. Therefore, the impedance matching of each of the probes 42 can be further adjusted by changing the dimension of the respective one of the air gaps 8 to improve the accuracy and reliability of the test results.

Figure 6:
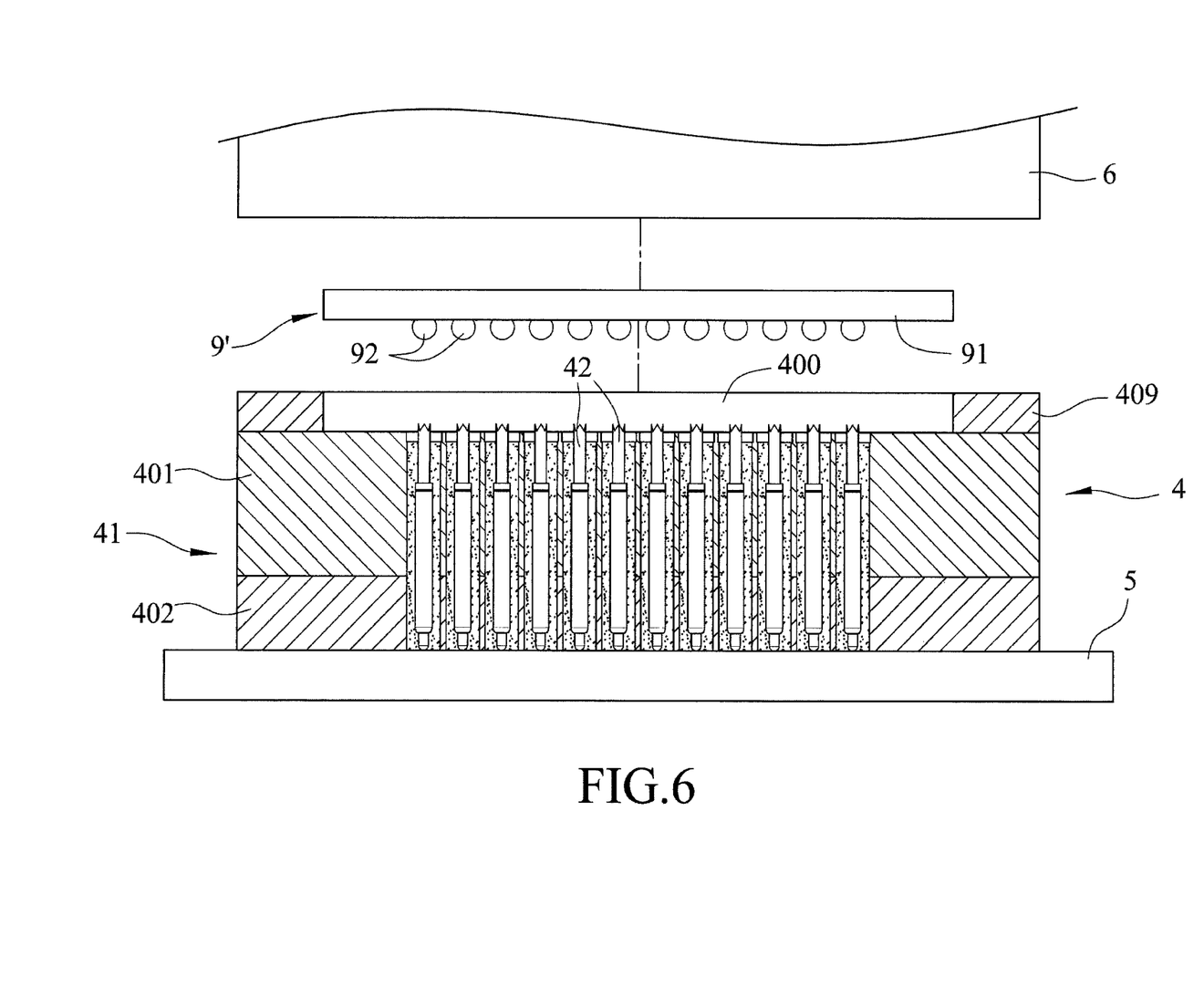
FIG. 6 is a schematically fragmentary cross-sectional view illustrating another modification of the embodiment of the testing method of the disclosure using still another configuration of the test device.

Referring to FIG. 6, another modification of the embodiment of the testing method of the disclosure using still another configuration of the test device is illustrated. The wafer is a diced wafer 9'. The test device 4 further includes a guiding member 409 on the upper part 401. The upper part 401 and the guiding member 409 cooperatively define a receiving space 400 for receiving the diced wafer 9'. When the diced wafer 9' is changed in size or shape, the size or shape of the guiding member 409 may be changed accordingly, such that the receiving space 400 and the diced wafer 9' can be matched. In one form, the probes 42 are formed into spring probes. Alternatively, the testing method of the disclosure may further include pressing the diced wafer 9' received in the receiving space 400 toward the upper part 401 of the probe card 41 by using a pressing member 6, thereby further ensuring the electrical connection between the probes 42 and the contact electrodes 92 of the diced wafer 9'.

To sum up, by virtue of using the test device 4 with the probe holes 411, the distance (d) between the axes (L) of the two adjacent ones of the probe holes 411 can be easily reduced, so that the spacing (p) between the two adjacent ones of the probes 42 can be reduced accordingly to match the smallest spacing (s) between the two adjacent ones of the contact electrodes 92. Therefore, the testing method is applicable to test the wafer level chip scale packages with enhanced accuracy of the test results.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A testing method for testing wafer level chip scale packages formed on a wafer, the wafer including a wafer substrate, and a plurality of spaced-apart contact electrodes disposed on the wafer substrate, the testing method comprising:

providing a test device including a probe card that has a first side adapted to be in contact with the wafer substrate and a second side opposite to the first side and that is formed with a plurality of parallel probe holes, and a plurality of probes that are respectively received in the plurality of parallel probe holes, the probe card being made of metal, a smallest spacing between two adjacent ones of the plurality of spaced-apart contact electrodes being not greater than 0.5 mm, the plurality of parallel probe holes having a uniform cross-sectional dimension, the plurality of probes extending respectively in the plurality of parallel probe holes along axes of the plurality of parallel probe holes, at least one distance between the axes of two adjacent ones of the plurality of parallel probe holes being equal to the smallest spacing between the two adjacent ones of the plurality of spaced-apart contact electrodes; and electrically connecting each of the plurality of spaced-apart contact electrodes of the wafer level chip scale packages to a corresponding one of the plurality of probes in such a manner that when the plurality of spaced-apart contact electrodes and the plurality of probes come into physical and direct contact with each other and with no other components in between them, said physical and direct contact causes the plurality of probes to be respectively and completely received in the plurality of parallel probe holes of the probe card, and said physical and direct contact simultaneously further causes the plurality of probes not to extend beyond the first side of the probe card so that electromagnetic interference among the plurality of probes is reduced.

2. The testing method of claim 1, wherein the test device further includes insulating fillers respectively disposed in the plurality of parallel probe holes and surrounding the plurality of probes.

3. The testing method of claim 2, wherein each of the plurality of probes includes two opposite end faces and a peripheral surface extending between the opposite end faces, each of the insulating fillers entirely surrounding the peripheral surface of a respective one of the plurality of probes, and not covering the opposite end faces of the respective one of the plurality of probes.

4. The testing method of claim 2, wherein each of the plurality of probes includes two opposite end portions and a peripheral surface extending between the opposite end portions, the peripheral surface of each of the plurality of probes being partially surrounded by a respective one of the insulating fillers such that an air gap is formed within a respective one of the plurality of parallel probes holes around a respective one of the plurality of probes.

5. The testing method of claim 1, wherein the probe card includes an upper part and a lower part connected to the upper part, the plurality of parallel probe holes extending through the upper part and the lower part.

6. The testing method of claim 5, wherein the test device further includes a guiding member on the upper part, the upper part and the guiding member cooperatively defining a receiving space for receiving the wafer.

7. The testing method of claim 6, wherein the plurality of probes are formed into spring probes, the testing method further comprising pressing the wafer received in the receiving space toward the upper part of the probe card.

* * * * *